(12) United States Patent
Kanehara

(10) Patent No.: US 6,309,896 B1
(45) Date of Patent: Oct. 30, 2001

(54) METHOD OF MANUFACTURING A FERROELECTRIC FILM

(75) Inventor: Takao Kanehara, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/585,548

(22) Filed: Jun. 2, 2000

(30) Foreign Application Priority Data

Feb. 22, 2000 (JP) .................................................. 12-044243

(51) Int. Cl.[7] .................................................. H01L 21/00
(52) U.S. Cl. .................................................. 438/3; 438/660
(58) Field of Search ................................ 438/3, 660, 679

(56) References Cited

U.S. PATENT DOCUMENTS 5,834,803 * 11/1998 Nashimoto ........................... 257/295
6,115,281 * 9/2000 Aggarwal et al. .................... 365/145
6,174,564 * 1/2001 Scott et al. ........................ 427/126.3

FOREIGN PATENT DOCUMENTS 08340084    12/1996  (JP) .
11121703    4/1999   (JP) .

* cited by examiner

Primary Examiner—Amir Zarabian
Assistant Examiner—Bradley Smith
(74) Attorney, Agent, or Firm—Venable; Keith G. Haddaway; Robert Frank

(57) ABSTRACT

A perovskite crystallized ferroelectric substance is formed over a lower electrode. A precursor solution, which serves as a ferroelectric film, is applied thereto and dried, followed by low-temperature anneal under the condition of a perovskite crystallization temperature or lower. Further, an upper electrode is formed and thereafter subjected to high-temperature anneal at a temperature of the perovskite crystallization temperature or higher to thereby perfectly crystallize the ferroelectric film, whereby a semiconductor element interposed between the electrodes can be formed.

16 Claims, 2 Drawing Sheets

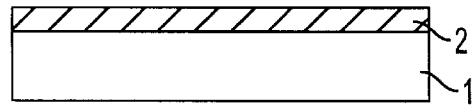
FIG. 1A
(PRIOR ART)
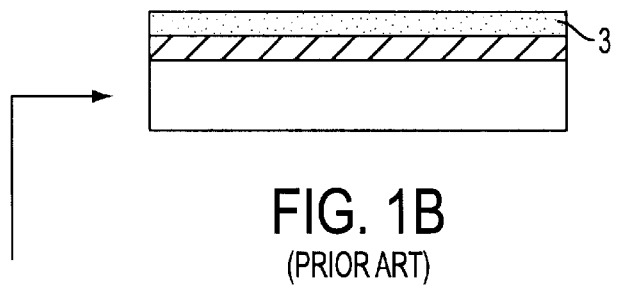
FIG. 1B
(PRIOR ART)
FIG. 1C
(PRIOR ART)
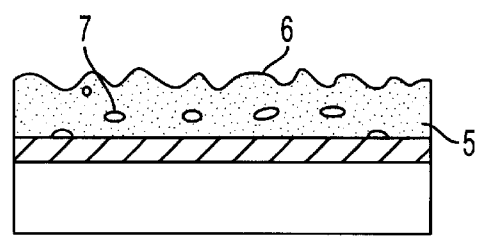
FIG. 1D
(PRIOR ART)

METHOD OF MANUFACTURING A FERROELECTRIC FILM

BACKGROUND OF THE INVENTION

1. Field of the Invention

The present invention relates to a method of growing a ferroelectric film employed in a semiconductor device, and particularly to a ferroelectric thin film memory which provides less leakage current and a high yield.

2. Description of the Related Art

With the advances in deposition or growth technology in recent years, a non-volatile memory or a ferroelectric capacitor has extensively been developed as a semiconductor element using a ferroelectric film. An example of such a non-volatile memory includes a ferroelectric random access memory (abbreviated as "FeRAM") using a polarization inverted characteristic of a ferroelectric thin film. Use of a ferroelectric film as a high-dielectric-constant film is known as a capacitor. Examples of ferroelectric film include a bismuth layered crystal structure oxide such as $Sr_2Bi_2Ta_2O_9$ (SBT), $SrBi_2(Ta, Nb) O_4$ (SBTN), or a perovskite structure oxide such as PbZrO (PZT). A process for growing this type of ferroelectric film is generally shown in FIGS. 1A through 1D.

A lower electrode 2 is formed over a silicon substrate 1 used as a bed by means of platinum (Pt) or iridium oxide ($IrO_2$) or the like (see FIG. 1A). A precursor solution 3 in which SBT is used as a ferroelectric material or substance is dissolved, is applied to the lower electrode 2 to thereby form a uniformly applied film by a spin coat method (see FIG. 1B).

Thereafter, the precursor solution is dried and subjected to calcination anneal at 800° C. or a temperature greater than a crystallization temperature for 30 minutes in an oxygen atmosphere to thereby obtain a crystallized SBT film 4 (see FIG. 1C). The process steps of FIGS. 1B and 1C for applying and calcining the precursor solution may be repeated plural times to reach a desired thickness, thereby forming a ferroelectric SBT film 5 having a desired thickness.

However, a problem arises in that since the ferroelectric material is strong in crystal anisotropy when the conventional growth process referred to above is used, irregularities or projections and depressions 6 are formed over the surface of the ferroelectric film 5 or voids 7 are generated in the ferroelectric film 5 as shown in FIG. 1D.

Applying the precursor solution plural times and then drying it to form the SBT film may principally lead to irregularities, and formation of voids. Therefore, leakage current may be increased between electrodes of a semiconductor memory using a ferroelectric film or a short may occur between the electrodes, thus reducing the reliability of the ferroelectric memory.

SUMMARY OF THE INVENTION

The present invention solves the above-described conventional problems. According to the present invention, a perovskite crystallized ferroelectric substance is formed over a lower electrode. A precursor solution, which serves as a ferroelectric film is applied to the ferroelectric substance and dried. Thereafter, the precursor solution is subjected to low-temperature anneal at the perovskite crystallization temperature or lower. Further, an upper electrode is formed thereon and thereafter subjected to high-temperature anneal at the perovskite crystallization temperature or higher to thereby perfectly crystallize the ferroelectric film, so that a semiconductor element interposed between the electrodes is formed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 1A through 1D respectively show a process for forming a ferroelectric film, according to a prior art.

DETAILED DESCRIPTION OF THE INVENTION

Figure 2A:
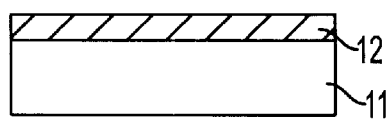
FIGS. 2A through 2G respectively illustrate a process for forming a ferroelectric film, which is used for describing an embodiment of the present invention.

A process for producing a ferroelectric film, which is used for describing a first embodiment, is shown in FIGS. 2A through 2G. Referring first to FIG. 2A, platinum (Pt), which serves as a lower electrode 12, is formed over a silicon substrate 11 by a sputtering method so as to range from about 2000 Å to about 3000 Å. If the material for the electrode is a conductor or conductive material having resistance to oxidation, such as iridium oxide, then electrode materials other than platinum can be utilized.

Figure 2E:
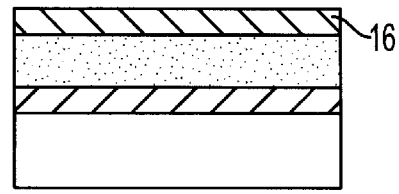
Figure 2B:
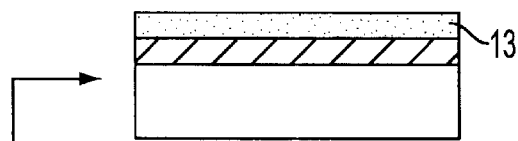

As also shown in FIG. 2B, a precursor solution 13 with a ferroelectric material or substance SBT dissolved therein is applied onto the lower electrode 12 and uniformized by a spin coater. The precursor solution at this time is a mixed solution of $Bl_2O_3$, $Ta_2O_5$, SrO and $Nb_2O_5$ corresponding to oxides of elements, which become components of the SBT, and butyl acetate used as a solvent.

Figure 2F:
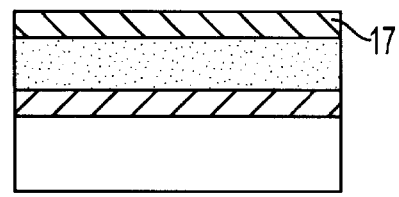
Figure 2C:
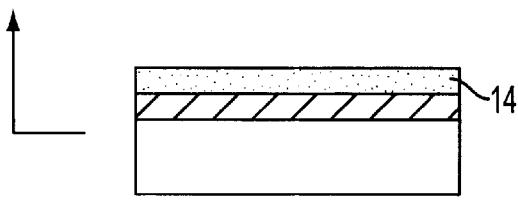

Further, as shown in FIG. 2C, the precursor solution is dried for five minutes by means of a hot plate held at a temperature of from about 150° C. to about 200° C. to evaporate and remove the solvent. Further, it is subjected to oxygen anneal by a calcination furnace for 30 minutes at a temperature of 800° C. to thereby crystallize the SBT applied film 13, so that a crystallized SBT film 14 is obtained. Since SBT is transferred to a perovskite structure by heat treatment at a temperature of about 700° C. or higher, the SBT film at this time takes a perovskite crystal structure.

Figure 2G:
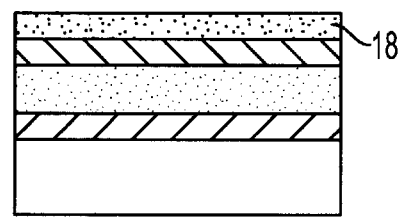
Figure 2D:
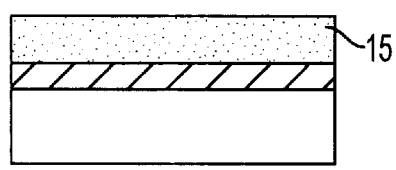

The process steps shown in FIGS. 2B and 2C are repeated three times in a manner similar to the prior art to thereby obtain an SBT film 15 having about 1500 Å as shown in FIG. 2D. Further, a precursor solution having a concentration of 23 wt. % of SBT is applied to the SBT film 15 as shown in FIG. 2E and then dried, so that an SBT applied film 16 having about 300 Å is formed as a flattened or planarized film so as to bury irregularities or projections and depressions of the SBT film 15. In order to planarize it, spin coating is performed at 1500 rpm for 30 seconds.

Next, the resultant SBT applied film is calcined by oxygen anneal at a temperature of 600° C. for 30 minutes as shown in FIG. 2F. The anneal condition at this time is such that the SBT film is held at a perfect crystallization temperature or less to such an extent that it partly starts pyrochlore crystallization from an amorphous state thereof. Such a state can be realized if an anneal temperature ranges from 600° C. to 700° C. Thus, the SBT applied film 16 results in an SBT film 17 in which an amorphous region and pyrochlore crystal region corresponding to an ever-dielectric phase partly included therein are mixed together.

Thereafter, platinum (Pt), which serves as an upper electrode 18, is formed by the sputtering method so as to range from about 2000 Å to about 3000 Å in FIG. 2G. The material is then [and] calcined by oxygen anneal for 30 minutes at a temperature of 800° C. to thereby perfectly crystallize the SBT film 17, and form a perovskite ferroelectric film in which the SBT films are multilayered. As described above, the perovskite crystal structure corresponding to a ferroelectric phase can be formed by annealing at a temperature of 700° C. or higher.

If the material for the upper electrode is a conductor or conductive material having resistance to oxidation, such as iridium oxide in a manner similar to the lower electrode, then electrode materials other than platinum can be utilized. The perfect crystallization of the ferroelectric film can be conducted about an effect similar to the present embodiment even before the formation of the upper electrode.

As described above, the precursor solution film composed of the ferroelectric material used for purposes of planarization is formed by the coating method so as to bury the projections and depressions of the crystallized ferroelectric film. Thereafter, it is annealed once at the temperature less than or equal to the perovskite crystallization temperature so as to accommodate the irregularities and further subjected to calcination anneal at the perovskite crystallization temperature or higher, thereby forming the ferroelectric film. It is therefore possible to form the irregularities-free ferroelectric film and reduce even the occurrence of voids due to the irregularities.

While the SBT film has been described as the ferroelectric film by way of example, the ferroelectric film may be a bismuth layered crystal structure oxide other than SBT or perovskite structure oxide if it is a film formed by using the precursor solution.

According to the process employed in the present embodiment, the ferroelectric film can be planarized without the projections and depressions and a void-free SBT film can be formed. As a result, leakage current is reduced and a ferroelectric thin film free of the occurrence of a short between electrodes is formed.

According to the present invention as described above, the ferroelectric film formed by means of the precursor solution resolves the problem of voids or irregularities encountered in conventional methods, so that a high-reliable ferroelectric film can be formed.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A method of manufacturing a ferroelectric film, comprising the following steps:
    forming a first layer of a perovskite crystallized ferroelectric film over a lower electrode formed over a semiconductor substrate;
    applying a precursor solution serving as a second layer of the same ferroelectric film material as the first layer onto the first layer of ferroelectric film;
    heating to evaporate a solvent from the precursor solution;
    forming a pyrochlore structure by annealing the second layer of the ferroelectric film at a perovskite crystallization temperature or lower;
    forming an upper electrode over the second layer of the ferroelectric film; and
    transforming the pyrochlore structure into a perovskite structure by annealing the second layer of the ferroelectric film at the perovskite crystallization temperature or higher.

2. The method according to claim 1, wherein said first ferroelectric film and said second ferroelectric film are respectively a bismuth layered crystal structure oxide.

3. The method according to claim 1, wherein said first ferroelectric film and said second ferroelectric film are respectively a perovskite crystal structure oxide.

4. The method according to claim 1, wherein said step for applying the precursor solution serving as the second layer of the ferroelectric film is carried out so as to bury depressions and projections in the surface of the first ferroelectric film.

5. The method according to claim 2, wherein said bismuth layered crystal structure oxide is an SBT.

6. A method of manufacturing a ferroelectric film, comprising the following steps:
    a step for forming a first layer of a perovskite crystallized ferroelectric film over a lower electrode formed over a semiconductor substrate;
    a step for applying a precursor solution serving as a second layer of the same ferroelectric film material onto the first ferroelectric film;
    a step for performing a heating process to evaporate a solvent from the precursor solution;
    forming a pyrochlore structure by annealing the second layer of the ferroelectric film at a perovskite crystallization temperature or lower;
    transforming the pyrochlore structure into a perovskite structure by annealing the second layer of the ferroelectric film at the perovskite crystallization temperature or higher; and
    a step for forming an upper electrode over the second layer of the ferroelectric film.

7. The method according to claim 6, wherein said first ferroelectric film and said second ferroelectric film are respectively a bismuth layered crystal structure oxide.

8. The method according to claim 6, wherein said first ferroelectric film and said second ferroelectric film are respectively a perovskite crystal structure oxide.

9. The method according to claim 6, wherein said step for applying the precursor solution serving as the second layer of the ferroelectric film is performed so as to bury depressions and projections in the surface of the first ferroelectric film.

10. The method according to claim 7, wherein said bismuth layered crystal structure oxide is an SBT.

11. The method according to claim 1, wherein forming the pyrochlore structure comprises annealing the second layer of the ferroelectric film at a temperature of from about 600° C. to about 700° C.

12. The method according to claim 6, wherein forming the pyrochlore structure comprises annealing the second layer of the ferroelectric film at a temperature of from about 600° C. to about 700° C.

13. The method according to claim 2, wherein transforming the pyrochlore structure into a perovskite structure comprises annealing the second layer of the ferroelectric film at a temperature of about 800° C.

14. The method according to claim 3, wherein transforming the pyrochlore structure into a perovskite structure comprises annealing the second layer of the ferroelectric film at a temperature of greater than about 700° C.

15. The method according to claim 7, wherein transforming the pyrochlore structure into a perovskite structure comprises annealing the second layer of the ferroelectric film at a temperature of about 800° C.

16. The method according to claim 8, wherein transforming the pyrochlore structure into a perovskite structure comprises annealing the second layer of the ferroelectric film at a temperature of greater than about 700° C.

* * * * *